(12) United States Patent
Wood et al.

(10) Patent No.: US 7,368,860 B2
(45) Date of Patent: May 6, 2008

(54) HIGH PERFORMANCE PIEZOELECTRIC ACTUATOR

(75) Inventors: Robert J. Wood, Berkeley, CA (US); Ronald S. Fearing, El Cerrito, CA (US); Jacoby L. Hickerson, Coulterville, CA (US)

(73) Assignee: The Regents of the University od California, Oakland, CA (US)

( * ) Notice: Subject to any disclaimer, the term of this patent is extended or adjusted under 35 U.S.C. 154(b) by 347 days.

(21) Appl. No.: 11/056,974

(22) Filed: Feb. 11, 2005

(65) Prior Publication Data

US 2006/0181179 A1    Aug. 17, 2006

(51) Int. Cl.
*H01L 41/04* (2006.01)
*H01L 41/08* (2006.01)
(52) U.S. Cl. ............... 310/367; 310/330; 310/331; 310/332
(58) Field of Classification Search ........ 310/330–332, 310/363–367
See application file for complete search history.

(56) References Cited

U.S. PATENT DOCUMENTS

| | | | | |
|---|---|---|---|---|
| 2,980,811 A | * | 4/1961 | Jacque | 310/367 |
| 3,500,451 A | * | 3/1970 | Yando | 310/367 |
| 5,632,841 A | * | 5/1997 | Hellbaum et al. | 310/330 |
| 5,639,850 A | | 6/1997 | Bryant | |
| 5,977,689 A | * | 11/1999 | Neukermans | 310/328 |
| 6,980,388 B2 | * | 12/2005 | Ishikawa et al. | 360/75 |
| 2006/0180953 A1 | | 8/2006 | Wood et al. | |

OTHER PUBLICATIONS

Goo et al.; *Behaviors and Performance Evaluation of a Lightweight Piezo-Composite Curved Actuator*: Journal of Intelligent Material Systems and Structures, vol. 12—Sep. 2001; pp. 639-646.
Wise, Stephanie A.; *Displacement properties of Rainbow and Thunder piezoelectric actuators*: Elsevier Science Sensors and Actuators A 69 (1998); pp. 33-38.
Yoon et al.; *Design and manufacture of a lightweight piezo-composite curved actuator*; Institute of Physics Publishing, Smart Materials and Structures 11 (2002); pp. 163-168.
Face International Corporation; *Thunder Actuators & Sensors*; ©2001 Face International Corporation pp. 1-10; http://www.face-int.com/thunder/tech/ttech.htm.

* cited by examiner

*Primary Examiner*—J. San Martin
(74) *Attorney, Agent, or Firm*—Brian N. Young; Trellis Intellectual Property Law Group, PC (57) ABSTRACT

A high performance piezoelectric actuator. The actuator includes a piezoelectric material exhibiting a selectively tapered width sufficient to enhance actuator fracture load capabilities. A passive material is disposed on or integrated with the piezoelectric material. A drive system is connected to the piezoelectric material. The drive system is capable of selectively applying an electric field to the piezoelectric material. In specific embodiment, the piezoelectric material includes a curved piezoelectric layer exhibits a default state of compression along a surface of the piezoelectric layer.

22 Claims, 6 Drawing Sheets

HIGH PERFORMANCE PIEZOELECTRIC ACTUATOR

ACKNOWLEDGMENT OF GOVERNMENT SUPPORT

This invention was made with Government support under Grant (Contract) No. N00014-98-1-0671 awarded by ONR MURI. The Government has certain rights to this invention.

This application claims the benefit of U.S. Provisional Patent Application 60/470,456 filed May 14, 2003 and fully incorporated herein by reference.

BACKGROUND OF THE INVENTION

This invention is related in general to actuators. More specifically, embodiments of the present invention relate to piezoelectric actuators.

Piezoelectric actuators are employed in various demanding applications including robotic flying insects, miniature optical switches, inkjet printers, and micropumps. Such applications demand miniature actuators that can reliably produce relatively large displacements under high dynamic loads.

Piezoelectric actuators are often constructed from dielectric ceramic single crystal or amorphous polycrystalline ceramics, which expand or contract in response to an applied electric field. Unfortunately, conventional piezoelectric ceramics exhibit problematic surface defects resulting from ceramic crystal growth and subsequent processing. Processing may involve cutting piezoelectric materials via a diamond saw or laser. Both cutting methods yield undesirably rough surfaces with relatively large cracks that weaken the piezoelectric materials.

Inherent surface and edge defects in conventional ceramic piezoelectric materials often significantly reduce actuator fracture toughness and fatigue life. Furthermore, such defects cause material stress concentrations, which limit usable working stress range and thereby lower actuator energy density, i.e., work-performing capability per unit mass. Accordingly, actuator operating range is confined to avoid device fracture.

To reduce average crack size, piezoelectric materials are often polished. However, conventional polishing techniques may yield a surface layer of incomplete grains that may actually weaken the piezoelectric material.

SUMMARY OF EMBODIMENTS OF THE INVENTION

One embodiment of the present invention provides a piezoelectric actuator that includes a piezoelectric material exhibiting a tapered width. A passive material is disposed on or integrated with the piezoelectric material. A drive system is connected to the piezoelectric material. The drive system is capable of selectively applying an electric field to the piezoelectric material.

In a more specific embodiment, the piezoelectric material includes a curved piezoelectric layer that exhibits a default state of compression along a surface of the piezoelectric layer. The piezoelectric material includes amorphous ceramic (such as PZT-5H) or single-crystal piezoelectric material (such as PZN-PT).

In an illustrative embodiment, the piezoelectric actuator further includes a rigid extension that is positioned at one end of the piezoelectric layer, which exhibits a tapered width. The rigid extension, with an approximately uniform width, is affixed to a wide end of the piezoelectric layer. In this embodiment, the rigid extension is constructed from high modulus relatively nonconductive material, such as S2Glass. The passive material forms a passive layer that backs the piezoelectric layer.

In the illustrative embodiment, the passive layer and the piezoelectric layer have selectively mismatched coefficients of thermal expansion that are sufficient to improve actuator fracture load capabilities. The passive layer includes ultra-high modulus materials, such as ultra-high modulus carbon fiber materials. The passive layer is relatively conductive, and therefore may further act as an electrode to facilitate driving the actuator via the drive system. The piezoelectric layer is a polished layer, wherein the edges are coated with a compressive polymer film, such as polyimide. The piezoelectric layer may also act as an electrode.

Various features of certain embodiments of the present invention, including tapered piezoelectric layers, surfaces biased in a state of compression, surfaces polished and defects sealed via a compressive polymer film, mismatched coefficients of thermal expansion between piezoelectric and passive layers, and so on, help to enable high performance actuators that perform close to the strain energy density limits for a bulk free piezoelectric material. Furthermore, high performance piezoelectric materials exhibiting high coupling coefficients, which were previously impractical for use in high-stress applications due to their reduced fracture toughness, may now be employed in many such high-stress applications.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only, wherein:

DETAILED DESCRIPTION OF EMBODIMENTS OF THE INVENTION

Figures 1, 2:
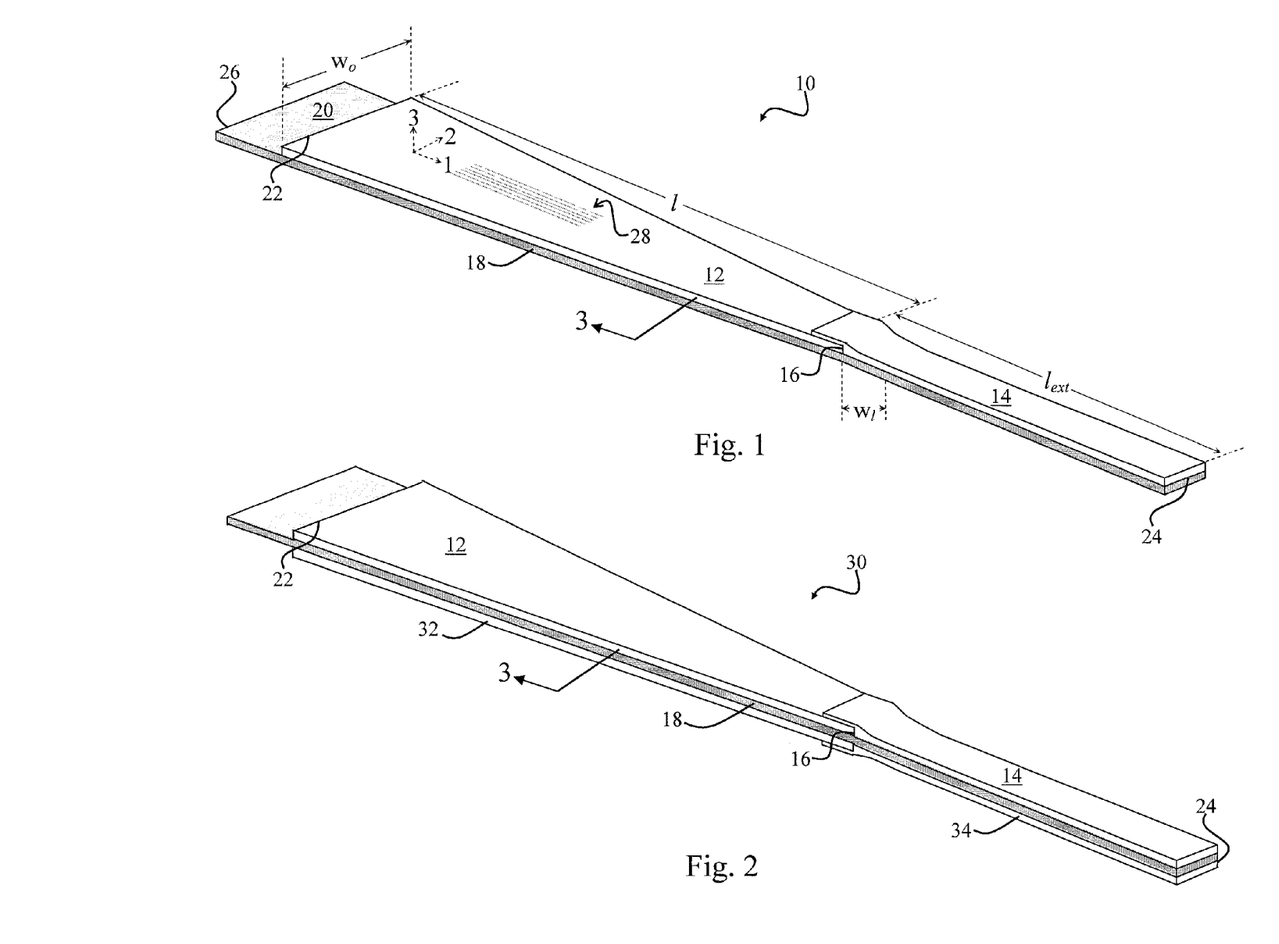
FIG. 1 is a perspective view of a unimorph piezoelectric actuator according to a first embodiment of the present invention.
FIG. 2 is a perspective view of a bimorph piezoelectric actuator according to a second embodiment of the present invention.

Referring now to FIG. 1, there is seen a perspective view of a unimorph piezoelectric actuator 10 according to a first embodiment of the present invention. For clarity, various well-known components, such as power supplies, actuator mounting systems, and so on, have been omitted from the figures. However, those skilled in the art with access to the present teachings will know which components to implement and how to implement them to meet the needs of a given application.

The unimorph actuator 10 includes a width-tapered piezoelectric layer 12 with an abutting rigid extension 14 that extends from a narrow distal end 16 of the piezoelectric layer 12. The rigid extension 14 is shown partially overlapping the narrow end 16 of the piezoelectric layer 12, which facilitates securing the rigid extension 14 relative to the piezoelectric layer 12. The overlap may be omitted without departing from the scope of the present invention.

The piezoelectric layer 12 and accompanying rigid extension 14 are disposed on a common backing 18. The common backing 18 is an elastic passive layer that is coincident with the piezoelectric layer 12 and rigid extension 14 with the exception of a trapezoidal elastic portion 20 that extends beyond a proximal wide end 22 of the piezoelectric layer 12. The piezoelectric layer 12 and rigid extension 14 may be bonded to or integrated with the underlying elastic passive layer 18 via methods well known in the art.

For the purposes of the present discussion, the length of the rigid extension ($l_{ext}$) is measured from the narrow end 16 of the piezoelectric layer 12 to a free end 24 of the actuator 10. The length (l) of the piezoelectric layer 12 is measured from the wide end 22 of the piezoelectric layer 12 to the narrow distal end 16 of the piezoelectric layer 12. The length of the actuator 10 is measured from a back edge 26 of the elastic passive layer 18 to the end of the free end 24 of the actuator 10.

The rigid extension 14 has an approximately rectangular footprint, i.e., has approximately uniform width. The piezoelectric layer 12 has an approximately trapezoidal footprint, i.e., exhibits a tapered width. The width ($W_l$) of the rigid extension 14 is approximately equal to the width ($W_l$) of the narrow end 16 of the actuator 10.

Suitable piezoelectric materials for the piezoelectric layer 10 include amorphous polycrystalline ceramics, such as PZT-5H, and ferroelectric relaxor-based single-crystal ceramics, such as PZN-PT. In the present specific embodiment, the piezoelectric layer 12 is constructed from PZT-5H, which is cost-effective and has a relatively high elastic modulus. The piezoelectric layer 12 comprises a single layer of an amorphous piezoelectric, such as laminated PZT 28, or a single crystal that is oriented approximately parallel to a first piezoelectric axis (1) and perpendicular to a second piezoelectric axis (2). A third piezoelectric axis (3) is perpendicular to a plane formed by the first axis (1) and the second axis (2).

Suitable passive materials for the elastic passive layer 18 include Unidirectional Ultra-High-Modulus Carbon Fiber (UHMCF) material. Constituent UHMCF fibers are affixed to the piezoelectric layer 12 and oriented along an axis of maximum applied stress of the actuator 10. In the present specific embodiment, the axis of maximum applied stress is approximately parallel to the first piezoelectric axis (1).

The piezoelectric layer 12 is pre-polished before a crack-sealing compressive polymer, such as polyimide PI-2525, is applied to the surface, including edges of the piezoelectric layer 12. Polishing and crack-sealing according to the present teachings significantly improve fracture load capability of the actuator 10. Furthermore, piezoelectric materials and passive-layer materials are chosen so that they exhibit sufficiently different coefficients of thermal expansion to improve actuator fracture load capability as discussed more fully below.

Exact material choice is application specific. Materials other than or in addition to PZT-5H, PZN-PT, and UHMCF may be employed to implement embodiments of the present invention without departing from the scope thereof.

In the preferred embodiment, the rigid extension 14 is stiffer than approximately ten times that of the overall actuator 10 without the rigid extension 14. Exemplary materials for the rigid extension 14 include layered high-modulus unidirectional S2Glass that is bonded with high-modulus epoxy resin.

Typically, the proximal end 26 of the actuator 10 mounts to a base or substrate, such as a mechanical insect body (not shown). For the purposes of the present discussion, the distal end of a component is the end opposite the proximal end. The distal end is often the end that exhibits most displacement during actuation of the actuator 10. Hence, in embodiment of FIG. 1, the distal end of the actuator corresponds to the free end 24.

Effects of Actuator Width Variation and Rigid Extension on Actuator Characteristics The width ($w_o$) of the proximal wide end 22 of the actuator 10 is strategically chosen relative to the width ($w_l$) of the narrow end 16 of the actuator 10 to maximize improvements in actuator energy density ($D_u$) and fracture load capability.

Undesirably large stresses occurring in the piezoelectric layer 12 are limited, via selective tapering of the width of the piezoelectric layer 12. The trapezoidal shape of the piezoelectric layer 12 reduces peak stresses and thereby improves load to fracture and actuator energy density.

The following mathematical description of the present embodiment 10 of FIG. 1 represents a detailed characterization of the specific embodiment 10 of FIG. 1. The mathematical characterization includes some approximations and simplifications. In particular, bonding between sublayers of the piezoelectric layer 12; between sublayers of the passive layer 18; and between the passive layer 18 and the piezoelectric layer 12 is considered perfect, such that no shear strain occurs between layers. Furthermore, amorphous ceramic piezoelectric materials employed to construct piezoelectric layer 12 are assumed to be transversely isotropic. When the piezoelectric layer 12 is transversely isotropic, piezoelectric constants associated with directions (1) and (2) and measured with electrodes perpendicular to axis (3) are equal, i.e., $d_{31}=d_{32}$. Furthermore, the shear piezoelectric constant about axis (3) measured with electrodes perpendicular to axis (3) is zero, i.e., $d_{36}=0$. Hence, the piezoelectric layer 12 is assumed to not experience axial stresses or strains about axis (3).

In applications wherein the piezoelectric layer 12 is constructed via single-crystal piezoelectrics rather than amorphous piezoelectrics, the piezoelectric constants are assumed to vary with the orientation of the axis (axis (1), (2), and (3)) relative to the crystal directions. However, in a properly cut crystal, the crystal planes are aligned with the actuator geometry such that the crystals are parallel to axis (1).

Furthermore, no axial loading of the actuator 10 is considered. Only the case wherein transverse loading is applied at the distal end 24 of the actuator is considered. In addition, all laminates employed to construct the piezoelectric layer 12 and the elastic passive layer 18 are considered moisture free. Hence, moisture-induce strains are not considered.

Table 1 below provides a mathematical description of the actuator 10 of FIG. 1. Those skilled in the art may generalize the following description to mathematically characterize other embodiments disclosed herein. Those skilled in the art will appreciate that the mathematical description in Table 1 below applies generally to actuators constructed according to the present teachings regardless of number, piezoelectric layer anisotropy, orientation of constituent layers, number of layers, placement of layers, or makeup of piezoelectric layers.

TABLE 1

| Parameter | Abbreviation | Complete Model | Units |
|---|---|---|---|
| Displacement | $\delta$ | $\frac{Pl^2}{2} G_\delta$ | m |
| Blocked Force | $F_b$ | $\frac{3P w_{nom}}{2 C_{44} l} G_{Fb}$ | N |
| Mechanical Energy | $U_m$ | $\frac{3P^2 l w_{nom}}{8 C_{44}} G_U$ | J |
| Energy Density | $D_U$ | $\frac{\frac{3P^2}{8 C_{44}} G_U}{\sum_n \rho_n t_n}$ | Jkg$^{-1}$ |
| Stiffness | k | $\frac{3 w_{nom}}{C_{44} l^3} \frac{G_{Fb}}{G_\delta}$ | Nm$^{-1}$ |

With reference to Table 1, $G_\delta$ is the free displacement geometry constant such that $G_\delta = (1+2l_r)$, where $l_r$ is called the extension ratio (also called length ratio) of the rigid extension 14. $l_r$ is the ratio of the length ($l_{ext}$) of the rigid extension 14 to the length (l) of the piezoelectric layer 12. $\rho_n$ is the mass density of the n$^{th}$ actuator sublayer. $t_n$ is the thickness of the n$^{th}$ actuator sublayer. The sum over all n sublayers includes sublayers of the piezoelectric layer 12 and the passive layer 18.

$w_{nom}$ is the nominal width of the actuator 10, which corresponds to the width of the piezoelectric layer 12 midway between the proximal end 22 and the distal end 16, i.e., $w_{nom} = (w_o + w_l)/2$. $G_{Fb}$ is the blocked-force geometry constant and is given by the following equation:

$$G_{Fb} = \frac{(1 + 2l_r)}{G_2}, \quad (1)$$

where $G_2$ is a function of the width ratio ($w_r$) and length ratio ($l_r$) as given below. $w_r$ is ratio of the width ($w_o$) of the actuator 10 at the proximal end 22 of the piezoelectric layer 12 to the width ($w_l$) of the actuator 10 at the distal end 16 of the piezoelectric layer 12.

$$G_2 = \frac{-6(w_r - 1)(-3 + 4l_r(w_r - 1) + 2w_r) + 3(-2 + 2l_r(w_r - 1) + w_r)^2 \ln\left(\frac{2 - w_r}{w_r}\right)}{8(1 - w_r)^3} \quad (2)$$

$G_U$ is the product $(G_\delta) \cdot (G_{Fb})$. P is given by the following equation:

$$P = C_{41} N_x^P + C_{42} N_y^P + C_{44} M_x^P + C_{45} M_y^P \quad (3)$$

where $N_x^P$ and $N_y^P$ represents piezoelectric forces generated within the actuator 10 at a position x along axis (1) and at position y along axis (2), respectively. $M_x^P$ and $M_x^P$ represent piezoelectric moments generated within the actuator 10 at a position x along axis (1) and at position y along axis (2), respectively. The $C_{ij}$ terms of equation (3) are given by the following equation:

$$C_{ij} = \begin{bmatrix} A_{ij} & B_{ij} \\ B_{ij} & D_{ij} \end{bmatrix}, \quad (4)$$

where $A_{ij}$, $B_{ij}$, and $D_{ij}$ are matrices, wherein the terms associated with the i$^{th}$ row and j$^{th}$ column of each matrix are given by the following equations:

$$A_{ij} = \sum_n (\overline{Q}_{ij})_n (z_n - z_{n-1}) \quad (5)$$

$$B_{ij} = \frac{1}{2} \sum_n (\overline{Q}_{ij})_n (z_n^2 - z_{n-1}^2)$$

$$D_{ij} = \frac{1}{3} \sum_n (\overline{Q}_{ij})_n (z_n^3 - z_{n-1}^3)$$

where $[\overline{Q}_{ij}]_n$ is an adjusted stiffness matrix containing plane strain-modified material constants for the n$^{th}$ actuator sublayer, which includes layers within the piezoelectric layer 12 and the passive layer 18. The i and j subscripts are matrix indices, but they also represent stress and strain directions. For example, a strain along axis i results from a stress along axis j. For indices greater than 3, the stress or strain is in shear about the axis (j-3) or (i-3) axis. Terms of $[\overline{Q}_{ij}]_n$ are generalized to arbitrary orientations of lamina fiber 28 via a transformation matrix that is known in the art. $z_n$ represents the vertical distance of the n$^{th}$ sublayer from the center of the actuator 10, i.e., the perpendicular distance from the n$^{th}$ sublayer to the mid-plane of the actuator 10. Hence, $z_n z_{n-1}$ represents the thickness of the n$^{th}$ sublayer. Note that P depends on the thickness ($t_p$) of the passive layer 18 and sublayers.

With reference to Table 1, note that the energy density ($D_U$) of the actuator 10 is the mechanical energy ($U_m$) of the actuator 10 divided by the mass ($m_a$) of the actuator 10, which is given by the following equation:

$$m_a = \sum_n \rho_n t_n w_{nom} l \quad (6)$$

where the variables are as described above. Furthermore, note that the mechanical energy ($U_m$) of the actuator 10 is proportional to the area ($l \cdot w_{nom}$) of the actuator 10.

The blocked force ($F_b$) of a piezoelectric actuator 10 represents the force required to block the actuator 10, i.e., to prevent the distal end 24 of the actuator 10 from moving when the actuator 10 is activated via application of an electric field. The displacement ($\delta$) of the piezoelectric actuator 10 represents movement of the free end of the actuator 10, which corresponds to the distal end 24, in response to an applied electric field.

In the present specific embodiment, an electric field is applied to the piezoelectric layer 12 so that field lines are approximately parallel to axis (3) as discussed more fully below. This causes the piezoelectric layer 12 to contract, thereby bending the actuator 10.

Further details as to how the equations of Table 1 and equations (1)-(6) were derived are available in a paper entitled OPTIMAL ENERGY DENSITY PIEZOELECTRIC BENDING ACTUATORS, by R. J. Wood, E. Steltz, and R. S. Fearing, (to appear in *J. of Sensors and Actuators A: Physical*) written May 11, 2004, which may be obtained from the assignee of the present invention. Those skilled in the art will appreciate that derivation details are not required for those skilled in the art to make and use the invention disclosed and claimed herein.

Additional terms and equations employed to characterize piezoelectric actuators are discussed in co-pending U.S. patent application entitled MICROSTRUCTURES USING CARBON FIBER COMPOSITE HONEYCOMB BEAMS, Ser. No. 10/830,374, the teachings of which are herein incorporated by reference.

In operation, an electric field is applied to the piezoelectric layer 12, resulting in a uniform bending moment along the length of the actuator 10 as the length of the piezoelectric layer 12 changes. The change in length of the piezoelectric layer 12 causes a strain in the piezoelectric layer 12.

Referring now to FIG. 2, there is seen a perspective view of a bimorph piezoelectric actuator 30 according to a second embodiment of the present invention. The construction of the bimorph piezoelectric actuator 30 is similar to that of the unimorph actuator 10 of FIG. 1 with the exception of an additional piezoelectric layer 32 and additional rigid extension layer 34 are disposed on a side of the elastic passive layer 18 opposite that of the first piezoelectric layer 12.

In the present specific embodiment, the piezoelectric layers 12, 32 of the actuator 30 approximately coincide such that little or no overlap occurs between the layers. However, the piezoelectric layers 12, 32 may be offset relative to each other without departing from the scope of the present invention.

The mathematical characterization of the actuator 10 of FIG. 1 as given in Table 1 may be readily extended by those skilled in the art to apply to the bimorph actuator 30 of FIG. 2. The bimorph actuator 30 actuates in response to an electric field that is strategically applied to the top piezoelectric layer 12 and to the bottom piezoelectric layer 32 as discussed more fully below.

Figures 3, 4:
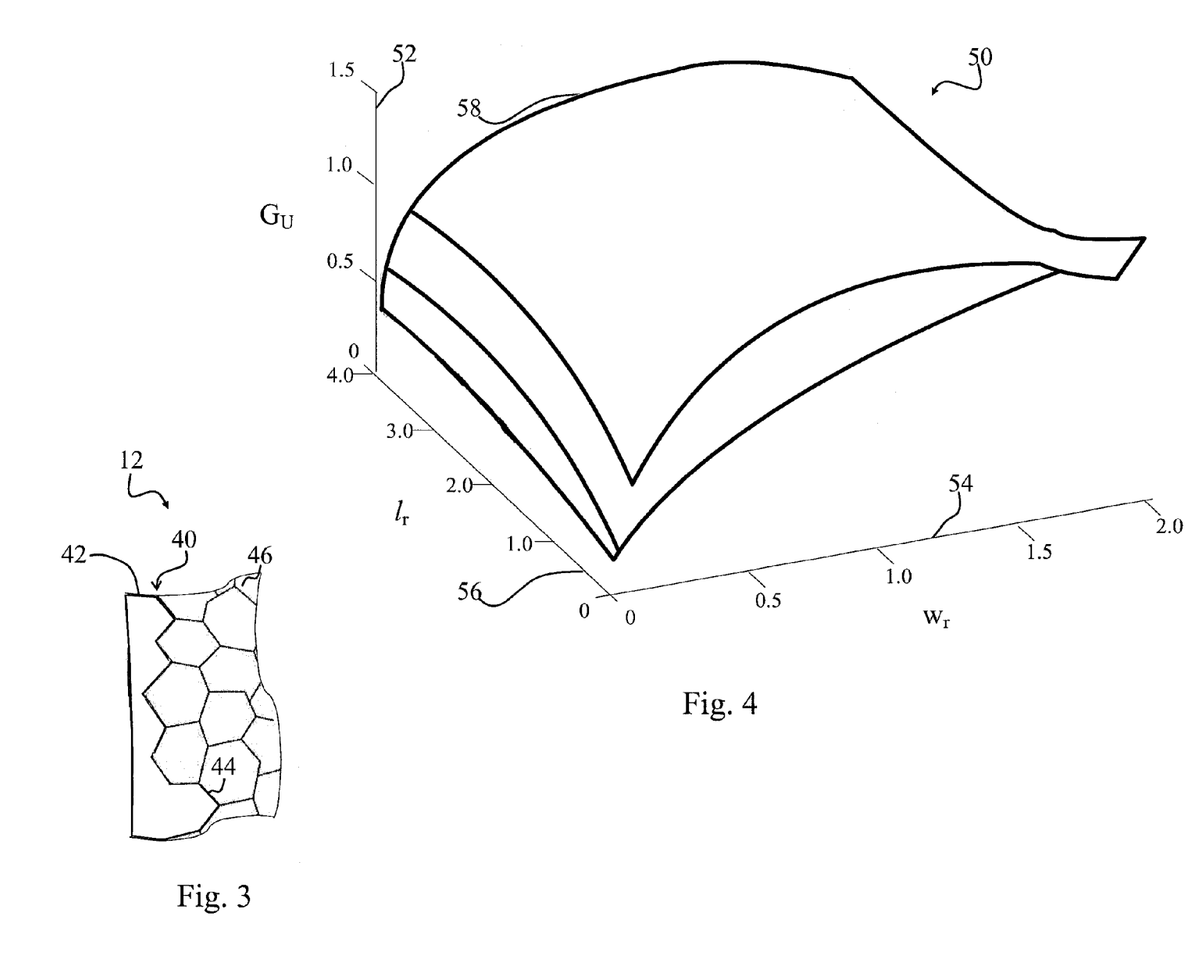
FIG. 3 is a sectional view of a piezoelectric surface with a compressive polymer coating employed by the actuators of FIGS. 1 and 2.
FIG. 4 is a graph illustrating actuator energy improvement as a function of the piezoelectric width ratio and the actuator extension ratio of the piezoelectric actuators of FIGS. 1 and 2.

Referring now to FIG. 3, there is seen a sectional view of a piezoelectric surface 40 with a compressive polymer coating 42 employed by the actuators 10, 30 of FIGS. 1 and 2. The compressive polymer coating 42 is a layer in tension, i.e. is a constricting layer that counteracts tensile stresses along edges of the piezoelectric layers 12 of FIGS. 1 and 2. The piezoelectric layer 32 of FIG. 2 includes a similar compressive polymer coating.

The present specific embodiment, the compressive polymer surface coating 42 coats only edges of the piezoelectric layer 12 of the actuators 10 and 30 of FIGS. 1 and 2. The coating 42 may also coat all exposed surfaces of the piezoelectric layer 13 in addition to edges without departing from the scope of the present invention.

The compressive polymer coating 42 is applied after laser micromachining and polishing of the piezoelectric layer 12. Strategic use of the compressive polymer surface coating 42 in combination with piezoelectric surface polishing as disclosed herein may significantly improve fracture load capabilities of the actuator 10.

Weakening effects of piezoelectric surface defects, such as are defect 44, are mitigated by both polishing the piezoelectric surface 40 and by applying the compressive coating 42. Surface cracks and defects, such as the defect 44, act as stress amplifiers. Defect sizes and numbers are reduced by polishing, and crack growth is inhibited via the compressive coating 42. Hence, the polymer coating 42 acts to limit problematic stress concentrations caused by surface defects. In addition, pre-polishing the piezoelectric surface 40 reduces initial defect sizes and thereby further reduces associated stress concentrations resulting from the defects. This greatly enhances fracture toughness and associated load-bearing capabilities of the piezoelectric layer 12.

Suitable materials for the compressive polymer coating 42 include polymers with relatively high Coefficients of Thermal Expansion (CTEs), such as polyimide (PI-2525 from HD Microsystems). Polyimide PI-2525 has a cure temperature of approximately 325° C., a CTE (a) of approximately 50 μm/m·° C., and an elastic modulus of 2.5 GPa. Consequently, the residual compressive stress produced by the layer 42 is approximately 40 MPa, which is approximately one third of the ultimate stress of the underlying piezoelectric layer 12. Consequently, such a compressive polymer coating 42 would provide a significant contribution in negating local stress intensity fields in an underlying piezoelectric material 46 of the piezoelectric layer 12.

Referring now to FIG. 4, there is seen a graph 50 illustrating actuator energy improvement ($G_U$) 52 as a function of the piezoelectric width ratio ($w_r$) 54 and the actuator extension ratio ($l_r$) 56 of the unimorph piezoelectric actuators 10, 30 of FIGS. 1 and 2. The term ($G_U = G_\delta \cdot G_{Fb}$) is a relative measure of the geometrically improved energy density due to the actuator rigid extension 14 and the trapezoidal width profile of the piezoelectric layer 12 of FIGS. 1 (see Table 1 and equation (1)).

With reference to Table 1 and FIGS. 1, 2, and 4, the rigid extension 14 abutting the piezoelectric layer 12 is designed to improve the energy density ($D_U$) of the actuators 10, 30, which are cantilever bending actuators. The energy ($U_m$) and energy density ($D_U$) of the actuators 10, 30 increase as the extension ratio ($l_r$) increases, since the energy ($U_m$) and energy density ($D_U$) vary with ($G_U$), which varies with the extension ratio ($l_r$). Hence, use of the rigid extension 14 improves actuator energy ($U_m$) and energy density ($D_U$) in accordance with the extension ratio ($l_r$). In the present embodiment, the maximum improvement in the energy density occurs as the extension ratio ($l_r$) approaches infinity, and this improvement is approximately a factor of 4/3=1.333 over that of a comparable actuator lacking the rigid extension 14.

Similarly, the actuator energy ($U_m$) and energy density ($D_u$) increase as the width ratio ($w_r$) increases, since the energy ($U_m$) and energy density ($D_u$) vary with ($G_U$), which increases as the width ratio ($w_r$) increases. Hence, strategic use of a trapezoidal profile improves actuator energy ($U_m$) and energy density ($D_u$) in accordance with the width ratio ($w_r$)

Furthermore, the actuator tip displacement ($\delta$) increases as the extension ratio ($l_r$) increases. Note that the displacement ($\delta$) is proportional to the free displacement geometry constant ($G_\delta$), which varies linearly with the extension ratio ($l_r$). Typically, the extension ratio is not increased indefinitely, since the mass 14 of the rigid extension may become a concern for a particular application.

A method for selecting actuator dimensions according to an embodiment of the present invention includes the following steps:

1. Maximize the width ratio ($w_r$) and the extension ratio ($l_r$) by choosing the point of maximum height on a surface 58 of the graph 50 of FIG. 4. The present embodiment employs a width ratio of approximately 1.5 and an extension ratio of 1.

2. Select the desired nominal width ($w_{nom}$) based on the selected width ratio ($w_r$) and a desired blocked force ($F_b$) and stiffness (k).

3. Employ Table 1 to determine the desired actuator length (l) based on a desired displacement ($\delta$) for a particular application. In the present embodiment, a displacement of approximately 400 μm and a blocked force of approximately 100 mN are achieved with the bimorph configuration.

4. Determine the length of the rigid extension 14 based on the selected extension ratio ($l_r$) and the selected actuator length.

5. Determine the thickness of the elastic passive layer 18 by optimizing the energy density (see Table 1). In the present embodiment, the maximum energy density occurs at a passive layer thickness of approximately 75 μm and 40 μm, for the unimorph actuator 10 of FIG. 1 and the bimorph actuator 30 of FIG. 2, respectively.

6. Determine any remaining geometric parameters based on desired energy density, desired blocked force, stiffness, and displacement in accordance with Table 1.

Note that the displacement ($\delta$), blocked force ($F_b$), and energy density ($D_U$) are employed to choose actuator geometry, including passive layer thickness ($t_p$). With reference to Table 1, clearly energy density ($D_U$) is a function of passive layer thickness ($t_p$); displacement ($\delta$) is a function of actuator length (l) and passive layer thickness ($t_p$); and blocked force ($F_b$) is a function of the nominal width ($w_{nom}$), actuator length (l), and passive layer thickness ($t_p$).

Figure 5:
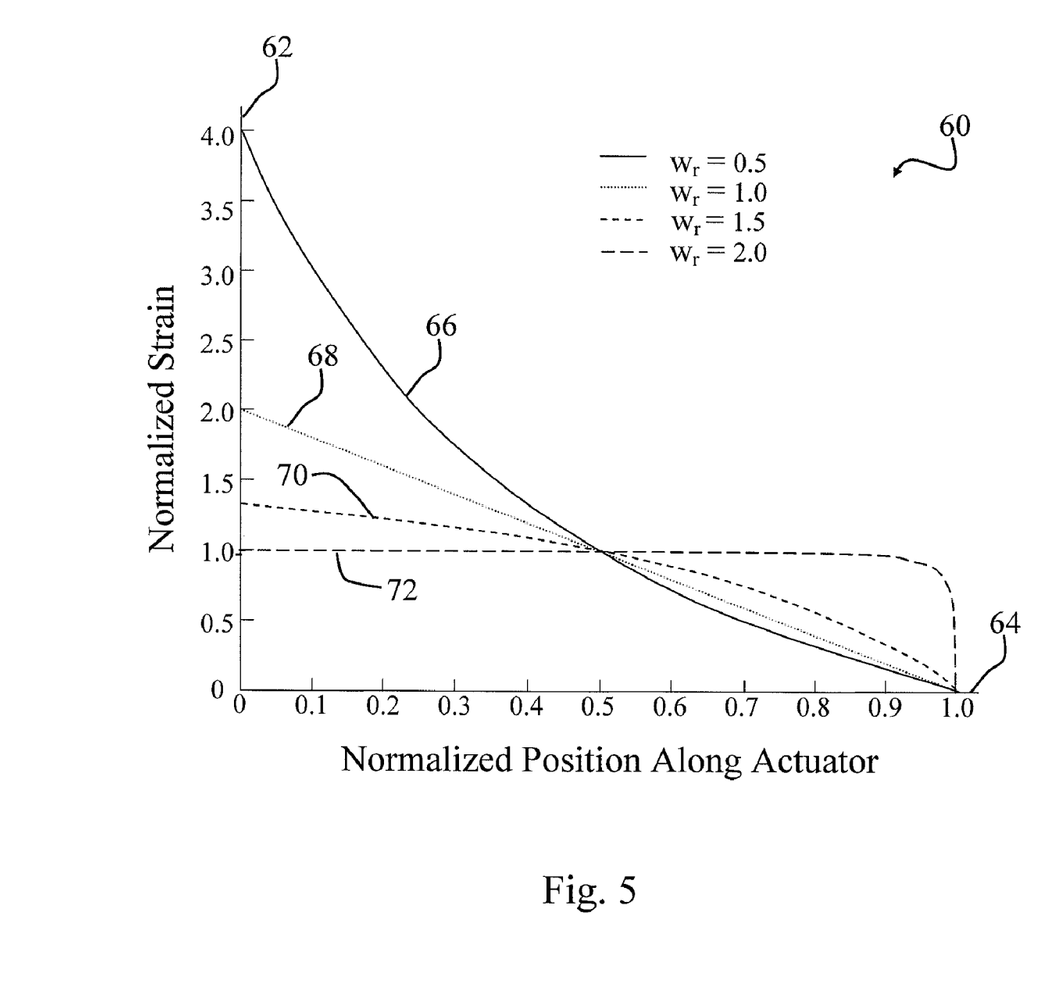
FIG. 5 is a graph illustrating normalized strain versus normalized position along the piezoelectric actuators of FIGS. 1 and 2.

Referring now to FIG. 5, there is seen a graph 60 illustrating normalized strain 62 versus normalized position 64 along the piezoelectric actuators 10, 30 of FIGS. 1 and 2 for various width ratios ($w_r$). The graph 60 was produced without accounting for the rigid extension 14 of the actuator 10 of FIG. 1. However, one skilled in the art can readily compute the effects of the rigid extension 14 on the results shown in FIGS. 5 without undue experimentation.

The graph 60 includes a first curve 66 associated with a width ratio of 0.5, a second curve 68 associated with a width ratio of 1.0, a third curve 70 associated with a width ratio of 1.5, and a fourth curve associated with a width ratio of 2.0.

With reference to FIGS. 1 and 5, note that the position along the actuator 10 is normalized in FIG. 5 so that the distal end 24 of the actuator 10 is 0, and the proximal end of the actuator 10 is 1.0. The normalized strain 62 near the distal end 16 of the piezoelectric layer 12 of FIG. 1 increases as the width ratio decreases below 2.0. Furthermore, for width ratios less than 2.0, the normalized strain 62 near the distal end 22 of the actuator 10 of FIG. 1 decreases toward the distal end 22 of the piezoelectric layer 12.

The graph 60 clearly illustrates that peak strains, and consequently, peak stresses experienced by the actuator 10, as reflected by the normalized strain curves 66-72, may be effectively controlled by strategically choosing the actuator width ratio ($w_r$). Consequently, selectively controlling the actuator width ratio ($w_r$) according to the present teachings enhances load-to-fracture capabilities of the actuator 10.

Figure 6:
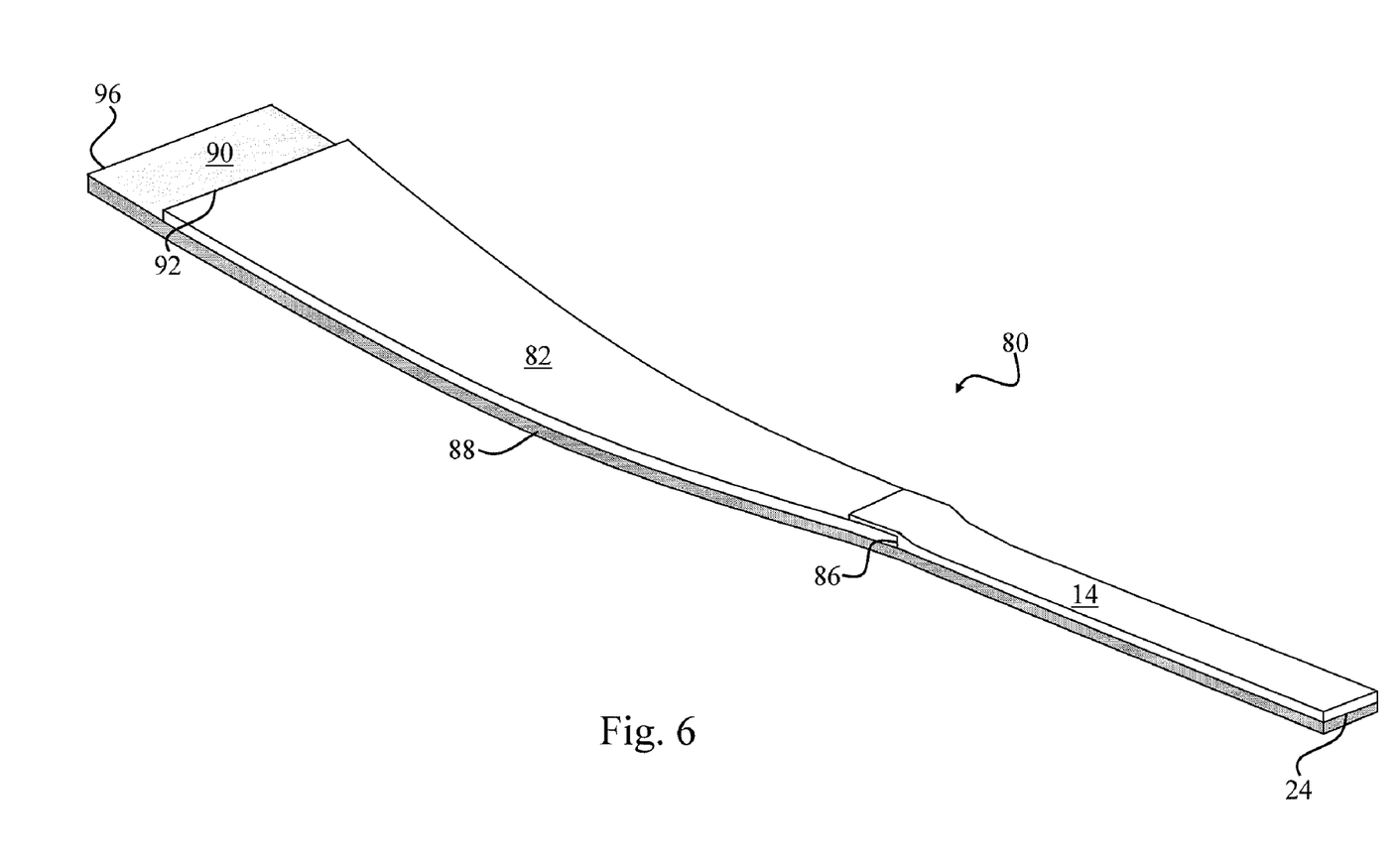
FIG. 6 is a perspective view of a curved unimorph actuator according to a third embodiment of the present invention.

Referring now to FIG. 6, there is seen a perspective view of a curved unimorph actuator 80 according to a third embodiment of the present invention. The curved unimorph actuator 80 is similar to the unimorph actuator 10 of FIG. 1 with the exception that the piezoelectric layer 12 and the passive layer 18 of FIG. 1 are replaced with a curved top layer 82 and a curved elastic passive layer 88 in FIG. 6, respectively. The layers 82 and 88 are curved via a molding process during curing as discussed more fully below.

The curved passive layer 88 exhibits a curved elastic portion 90 that extends beyond a proximal wide end 92 of the concave piezoelectric layer 82 to a back edge 96 of the curved passive layer 88. The curved piezoelectric layer 82 extends from a wide proximal end 92 to a narrow distal end 86. The rigid extension 14 abuts the curved piezoelectric layer 82 at the distal end 86 of the piezoelectric layer 82. The distal end 24 of the rigid extension 14 corresponds to the distal end of the curved unimorph actuator 80.

The concave piezoelectric layer 82 was formed in a curved mold so that the top surface of the layer 82 is in a default state of compression as discussed more fully below. For the purposes of the present discussion, a surface that is in a state of compression is a surface that experiences a negative stress, i.e., a compressive stress.

Since actuator mechanical energy ($U_m$) depends on the piezoelectric constant $d_{31}$, the change in the piezoelectric coupling coefficients due to compressed surface of the piezoelectric layer 82 yields a significant increase in actuator mechanical energy. Tests show a 15% increase in mechanical energy ($U_m$) and a 50% increase in load to fracture for the curved molded actuator 80 relative to a flat actuator.

Figure 7:
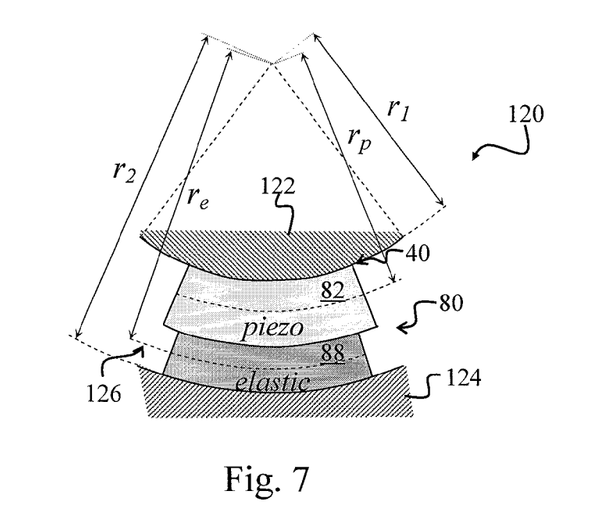
FIG. 7 is a vertical sectional view of a curved mold adapted to construct the unimorph piezoelectric actuator of FIG. 6.

Referring now to FIG. 7, there is seen a vertical sectional view of a curved mold 120 adapted to construct the unimorph piezoelectric actuator 80 of FIG. 6. The curved mold 120 includes an inner-radius portion 122 and an outer radius portion 124 with a curved space 126 therebetween. The curved space 126 provides the form factor to impart the desired curvature to the accompanying piezoelectric layer 82 and elastic layer 88 positioned therebetween.

With reference to FIGS. 6 and 7, the curved mold 120 is employed during curing of the actuator 80. The mold 120 bends the actuator layers 82, 88 while curing. In the present specific embodiment, the mold radius ($0.5(r_1+r_2)$), i.e., radius of curvature of the mold 120 is chosen to be twice that which would cause tensile fracture stress for the PZT piezoelectric layer 82.

During operation, a top surface 40 of the piezoelectric layer 82 experiences the greatest tensile stresses. Use of the curved mold 120 places the top surface 40 in an initial state of compression, which positively affects the piezoelectric coupling coefficient $d_{31}$, thereby improving actuator mechanical energy.

The mold 120 causes superimposed stress profiles within the piezoelectric layer 82 of the resulting combined cured layers 82, 88. Since actuator layers 82, 88 are not bonded together before curing, the mold 120 causes the stress profiles in each layer 82, 88 to be independent.

The curved mold 120 places a uniform moments ($M_i$) on the $i^{th}$ sublayer of the layers 82, 88 in accordance with the following equation:

$$M_i = \frac{E_{i,1} I_i}{r_i}, \quad (7)$$

where $E_{i,1}$ is the Young's modulus of the $i^{th}$ layer in the (1) direction, i.e., the axial direction; and $I_i$, and $r_i$ are the moment of inertia and the radius of curvature of the $i^{th}$ sublayer, respectively.

The stress ($\sigma_i$) that develops in the $i^{th}$ layer is given by the following equation:

$$\sigma_i = \frac{z_i E_i}{r_i} \quad (8)$$

where $z_i$ is the height of the $i^{th}$ sublayer with respect to the neutral axis of the actuator 80, which corresponds to the interface between the layers 82, 88 in the present embodiment.

Upon curing, the moments and stresses of equations (7) and (8) add to create total bending moment and stress on the resulting cured layers 82, 88. The total stress ($\sigma_p$) in the piezoelectric layer 82 resulting from reaction moments on the cured actuator 80 is approximately given by the following equation:

$$\sigma_p = \frac{-\sum M_i z}{Ae(r_c - z)} \left( \frac{E_p}{E_e} \right) \quad (9)$$

where $E_p$ is Young's modulus of the piezoelectric layer 82; $E_e$ is Young's modulus of the elastic passive layer 88; A is the total cross-sectional area of the cured layers 82, 88; e is the difference between the radius of the centroid and the radius of curvature ($r_c$) of the combined cured layers 82, 88; z is the distance from the neutral axis of the combined layers 82, 88. The neutral axis of the combined layers 82, 88 corresponds to the interface between the layers 82, 88 in the present embodiment.

Actuator molding according to the present embodiment significantly increases the load to failure and increases the mechanical energy of the resulting unimorph actuator 80 of FIG. 6. The curved mold 120 improves actuator mechanical energy at least partly through its effects on the piezoelectric coefficient $d_{31}$. Tests show significantly increased energy for the molded actuators with respect to flat actuators.

Figure 8:
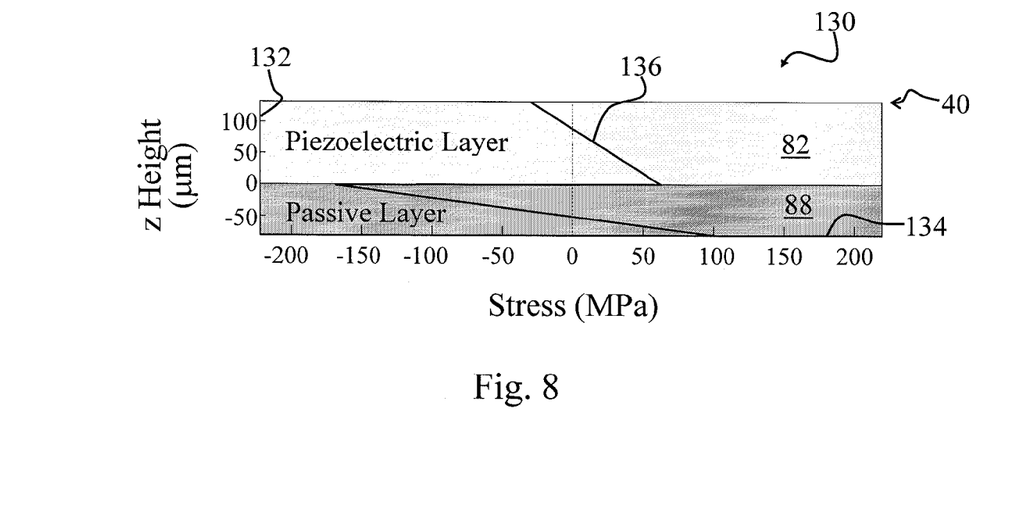
FIG. 8 is a graph illustrating stress versus vertical position within the unimorph actuator of FIG. 6.

Referring now to FIG. 8, there is seen a graph 130 illustrating stress 132 versus vertical position 134 within the unimorph actuator 80 of FIG. 6 for a mold radius of 0.065 meters. With reference to FIGS. 6, 7, and 8, the graph 130 shows a total stress profile 136. The total stress profile 136 is the sum of initial stress from the bending of the layers 82, 88 by the mold 120 before curing and the combined moment (see $\sigma_p$ of equation (9)) applied to the finished combined layers 82, 88.

Note that most of the piezoelectric layer 82 exhibits tensile stress as illustrated by the portion of the stress profile 134 in the piezoelectric layer 82 that is positive. The top surface 40 exhibits compressive stress as illustrated by the portion of the stress profile 134 in the piezoelectric layer 82 that is negative. Note that the effect of the rigid extension 14 of FIG. 6 is not incorporated in the results displayed in the graph 130 of FIG. 8.

SUMMARY OF PRE-STRESSING MECHANISMS

Conventional wisdom maintains that compressive pre-stressing, which is often associated with accompanying plastic and/or elastic deformation, is incompatible with relatively brittle piezoelectrics. However certain embodiments of the present invention successfully employ pre-stressing to enhance actuator performance. For the purposes of the present discussion, a compressive bias applied to an actuator is a net stress that acts to compress one or more actuator surfaces or portions thereof.

With reference to FIGS. 1, 2, and 6, the piezoelectric bending actuators 10, 30, 80 are selectively stress biased via multiple mechanisms to improve actuator performance. The stress biasing mechanisms include use of the curved mold 120 of FIG. 7, use of the compressive polymer surface coating 42 to prevent crack growth as shown in FIG. 3, and strategic use of mismatched CTEs between PZT-5H piezoelectric and UHMCF passive layers.

When free actuator materials are heated for curing, they freely expand or contract according to their CTEs. This heated state, before substantial cross linking of matrix epoxy occurs, is called the stress-free state. After bonding, the materials are joined at interfaces between piezoelectric layers and passive layers. By keeping the CTE of the elastic layers greater than the CTE of the piezoelectric layers, a compressive stress in the piezoelectric layers occur when the actuator is brought to room temperature. This applies to unimorph and bimorph actuator configurations as disclosed in FIGS. 1, 2, and 6.

Fabrication

With reference to FIGS. 1-8, various manufacturing techniques and materials are combined to manufacture the actuators 10, 30, 80 of FIGS. 1, 2, and 6. In the present embodiments, UHM unidirectional carbon fiber composites are employed for the passive layers 18, 88. Such carbon fiber composites are relatively good electrical conductors. Consequently, no additional electrodes are required within the actuator lay-up.

Nonconductive fiberglass layers are employed to create the rigid extension 14, but other materials, such as UHM materials may be employed for this extension without departing from the scope of the present invention. In the present embodiment, a high modulus (high stiffness) material, such as unidirectional S2Glass, is layered to stiffen the extension 14. Furthermore the present teachings may be employed to construct a multimorph actuator other than a bimorph actuator without departing from the scope of the present invention.

The present embodiment employs PZT-5H for the piezoelectric layers 12, 82. PZT-5H exhibits relatively high coupling coefficients. Laser-micromachining is employed to shape each layer 12, 82, 18, 88 through a computer-controlled precision pulsed laser to control dimensions and relative ply angles.

Bonding between layers 12, 82, 18, 88 and sublayers is achieved by the composite matrix epoxy while curing. Consequently, the actuators 10, 30, 80 do not require electrodes or additional bonding layers.

The various actuators 10, 30, 80 discussed herein are specific embodiments for specific applications. Those skilled in the art with access to the present teachings may readily modify and construct actuators to meet the needs of a given implementation without undue experimentation.

Figure 9:
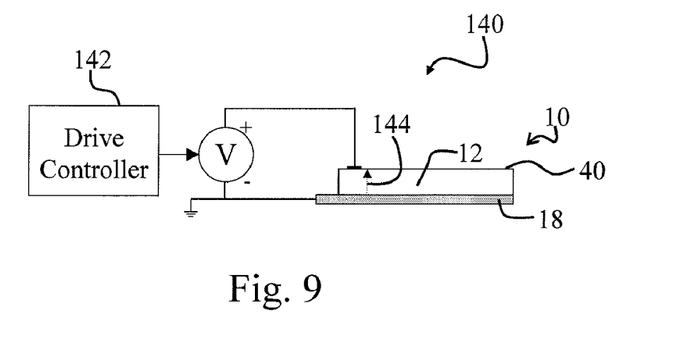
FIG. 9 is a schematic view of a drive system for driving the unimorph actuators of FIGS. 1 and 6.

Referring now to FIG. 9, there is seen a drive system 140 for driving the unimorph actuators 10, 80 of FIGS. 1 and 6. The drive system 140 is shown connected to the unimorph actuator 10 of FIG. 1 in FIG. 9. The drive system 140 includes a controllable Direct Current (DC) voltage source (V) that receives voltage-control input from a drive controller 142. A positive terminal of the voltage source (V) is connected the outer surface 40 of the piezoelectric layer 12, while a negative terminal of the voltage source (V) is grounded. In the present embodiment, the elastic passive layer 118 is also grounded. For clarity, the actuator extension 14 is not shown in FIGS. 9-11.

In operation, the controller controls magnitude and frequency of the voltage source (V). When the controller 142 activates the voltage source (V), an electric field 144 occurs within the actuator 10 so that the associated electric filed lines 144 extend approximately vertically from the elastic passive layer 18 and through the piezoelectric layer 12 to the outer surface 40 of the piezoelectric layer 12.

Unidirectional UHMCF composites, such as those used to construct the elastic passive layer 18, are relatively good electrical conductors. This eliminates the need for additional embedded electrodes in the passive layer 18 to facilitate driving the actuators. Similarly, additional electrodes are not required for the piezoelectric layer 12. However, additional electrodes may be employed without departing from the scope of the present invention.

Extension or contraction of the actuator 10 occurs when the piezoelectric materials are symmetric about the neutral axis, while bending will occur when this symmetry does not exist. The anisotropic passive constituent sublayers of the passive layer 18 produce a unidirectional composite that is capable of bending-twisting or extension-twisting coupling.

Applying an electric field to the piezoelectric layer 12 in a direction parallel to the polarization direction causes expansion or contraction in the (1) direction (see FIG. 1) according to the sign of the material $d_{31}$. Applying a field anti-parallel to the polarization direction will again cause expansion or contraction of the piezoelectric layer 12 up to a set field magnitude. Beyond this magnitude, depolarization occurs, rendering the actuator useless. This level is decreased in the presence of applied stresses and elevated temperatures. Thus, when applying the electric field 144 across the thickness of the piezoelectric layer 12 anti-parallel or to the polarization direction of the piezoelectric layer 12, care must be taken to limit field magnitudes. When the field 144 is applied anti-parallel to the piezoelectric polarization direction (direction 1 in the present embodiment), a large field magnitude or ambient temperature close to the Curie temperature may accelerate depoling.

Figure 10:
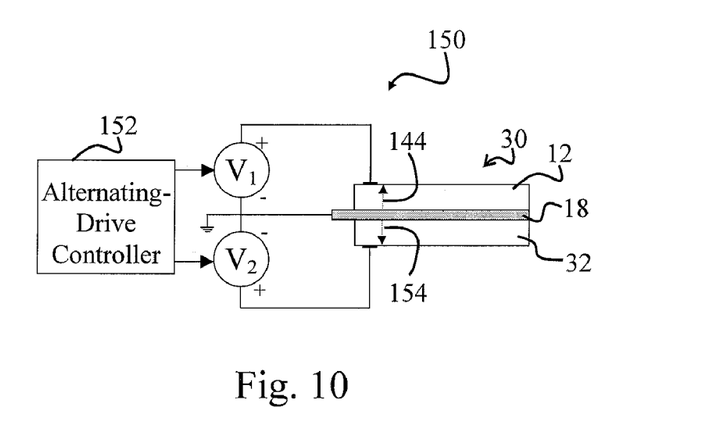
FIG. 10 is a schematic view of an alternating drive system for driving the bimorph actuator of FIG. 2.

Referring now to FIG. 10, there is seen a schematic view of an alternating drive system 150 for driving the bimorph actuator 30 of FIG. 2. The alternating drive system 150 includes a first controllable voltage source ($V_1$) and a second controllable voltage source ($V_2$), which receive control input from an alternating-drive controller 152. In the present specific embodiment, negative terminals of first voltage source ($V_1$) and the second voltage source ($V_2$) are grounded along with the intervening elastic passive layer 18. Positive terminals of first voltage source ($V_1$) and the second voltage source ($V_2$) are connected to the top piezoelectric layer 13 and the bottom piezoelectric layer 32, respectively.

In operation, the alternating drive controller 152 alternatively drives the voltage sources ($V_1$, $V_2$). The alternating drive system 150 is configured so that each piezoelectric layer 12, 32 is placed under a positive field relative to its polarization. This improves actuator performance and reduces the chance of depolarization.

Each piezoelectric layer 12, 32 is independently driven at different times and 180 degrees out of phase so that at any particular time, the bimorph actuator 30 is driven monopolar, like the drive system 140 of FIG. 9. Hence, when the first voltage source ($V_1$) is activated, the second voltage source ($V_2$) is off, and the electric field lines 144 extend from the elastic passive layer 18 through the top piezoelectric layer 12. Similarly, when the second voltage source ($V_2$) is activated, the first voltage source ($V_1$) is off, and a different set of field lines 154 extend from the elastic passive layer 18 down through the bottom piezoelectric layer 32.

By alternately driving the actuator 30 via the drive system 150, each piezoelectric layer 12, 34 is driven only in the positive sense. The alternating drive system 150 may be scaled to accommodate additional actuators without departing from the scope of the present invention. This drive system 150 employs 2n+1 wires for n actuators.

Figure 11:
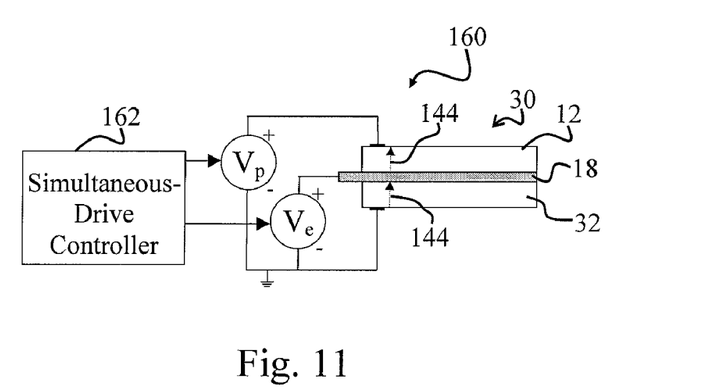
FIG. 11 is a schematic view of a simultaneous-drive system for driving the bimorph actuator of FIG. 2.

Referring now to FIG. 11, there is seen a schematic view of a simultaneous-drive system 160 for driving the bimorph actuator 30 of FIG. 2. The simultaneous-drive system 160 includes one controllable voltage source ($V_p$) with a positive terminal that is connected to the top piezoelectric layer 12 and a negative terminal that is grounded. An additional controllable voltage source ($V_e$) has a positive terminal that is connected to the elastic passive layer 18 and a negative terminal that is grounded along with the bottom piezoelectric layer 32. Both voltage sources ($V_e$, $V_p$) are simultaneously drive via control signals received from a simultaneous-drive controller 162.

In operation, the simultaneous-drive system 160 biases the entire bimorph actuator 30 so that electric field lines 144 extend from the bottom piezoelectric layer 32 through the top piezoelectric layer 12.

The simultaneous-drive system may be scaled to accommodate additional actuators without departing from the scope of the present invention. This drive system 160 employs n+2 wires to drive n actuators, since bias and ground connections may be common for plural actuators.

The simultaneous drive system 160 is particularly useful in applications that demand a simple driving configuration with few wires that facilitates high mechanical power output from accompanying actuators.

Results

With reference to FIGS. 1-11, the various actuators 10, 30, 80 of FIGS. 1, 2, and 6 are ultra high performance actuators. In tests, these actuators exhibit extensive improvements in various performance parameters over conventional actuators. Exemplary improvements for a particular implementation of an actuator according to the present teachings are summarized in the following table:

TABLE 2

| Method | $D_U$ Improvement | Fracture Load Improvement |
|---|---|---|
| Molding[1] | %15 | %50 |
| Width Tapering | %20 | %50 |
| Use of UHM Materials | %10 | — |
| Effect of CTE mismatching | — | %50 |
| Rigid Extension | %29 | — |
| Polishing | — | %20 |
| Crack Closing Techniques | — | %10 |
| Total | %74 | %180 |

Various descriptive parameters a particular implementation of an actuator constructed according to the present teachings are given below.

TABLE 3

| Parameter | Unimorph | Bimorph | Units |
|---|---|---|---|
| Displacement ($\delta$) | 350 | 455 | µm |
| Blocked force ($F_b$) | 95 | 120 | mN |
| Stiffness ($k_a$) | 240 | 300 | Nm$^{-1}$ |
| Energy ($U_m$) | 17 | 27 | µJ |
| Mass ($m_a$) | 18 | 11 | mg |
| Energy density ($D_U$) | 0.9 | 2.5 | Jkg$^{-1}$ |
| Quality factor (Q)[1] | 10 | 10 | — |
| Resonant frequency ($f_{res}$)[1] | 1000 | 3200 | Hz |
| Length (l) | 8 | 5 | mm |
| Extension ratio ($l_r$) | 0.625 | 1 | — |
| Nominal width ($w_{nom}$) | 1.75 | 1 | mm |
| Width ratio ($w_r$) | 1.5 | 1.5 | — |
| Passive layer layup | [0/0] | [0] | ° |
| Passive layer thickness | 100 | 40 | µm |

Actuators constructed in accordance with the present teachings may exhibit sufficiently increased load-bearing capabilities to enable effective use of single-crystal piezoelectrics with high piezoelectric coupling coefficients in various previously impractical applications.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A piezoelectric actuator comprising:
   a piezoelectric material having a tapered width;
   a passive material coupled to the piezoelectric material;
   a drive system coupled to the piezoelectric material, wherein the drive system selectively applies an electric field to the piezoelectric material; and
   a rigid extension abutting one end of the piezoelectric material and being positioned in a substantially coplanar longitudinal direction with respect to the piezoelectric material.

2. The actuator of claim 1, wherein the piezoelectric material includes
   a piezoelectric layer that is curved to cause a state of compression along a surface of the piezoelectric layer when the electric field is not applied.

3. The actuator of claim 2, wherein the piezoelectric material includes amorphous ceramic or single-crystal piezoelectric material.

4. The actuator of claim 3, wherein the piezoelectric material includes PZT-5H or PZN-PT materials.

5. The actuator of claim 2 wherein the rigid extension is affixed to a narrow end of the piezoelectric layer.

6. The actuator of claim 5 wherein the rigid extension exhibits uniform width.

7. The actuator of claim 5 wherein the rigid extension is constructed from high modulus S2Glass.

8. The actuator of claim 2 wherein the passive material forms a passive layer backing the piezoelectric layer, the passive layer and the piezoelectric layer having selectively mismatched coefficients of thermal expansion sufficient to improve actuator fracture load capabilities.

9. The actuator of claim 8 wherein the passive layer includes ultra-high modulus materials.

10. The actuator of claim 9 wherein the passive layer is an elastic layer that includes ultra-high modulus carbon fiber materials.

11. The actuator of claim 10 wherein the passive layer acts as an electrode.

12. The actuator of claim 8 wherein the piezoelectric layer is a polished layer that is at least partially coated with a compressive polymer film.

13. The actuator of claim 12 wherein the compressive polymer film includes polyimide.

14. The actuator of claim 13 wherein the piezoelectric layer acts as an electrode.

15. The actuator of claim 8 wherein tip displacement $\delta$ of the actuator is approximately characterized by the following equation:

$$\delta = \frac{Pl^2}{2} G_\delta,$$

where $G_\delta$ is a displacement geometry constant such that $G_\delta = (1+2l_r)$, where $l_r$ is called an extension ratio associated with the rigid extension; l represents a length of the piezoelectric layer; and P is a function of piezoelectric stiffness constants, forces, and moments associated with the piezoelectric layer.

16. The actuator of claim 8 wherein blocked force ($F_b$) of the actuator is approximately characterized by the following equation:

$$F_b = \frac{3Pw_{nom}}{2C_{44}l} G_{Fb}$$

where l is a length of the piezoelectric layer; $W_{nom}$ is a median or average width of the piezoelectric layer; and P is a function of piezoelectric stiffness constants, forces, and moments associated with the piezoelectric layer; $C_{44}$ is a function of a strain-modified material constants of the piezoelectric layer; and $G_{Fb}$ is a blocked-force geometry constant of the actuator that is a function of a width ratio of the piezoelectric layer and extension ratio between a length of the rigid extension and length l of the piezoelectric layer.

17. The actuator of claim 16 wherein energy density ($D_u$) of the actuator is approximately characterized by the following equation:

$$D_U = \frac{\frac{3P^2}{8C_{44}} G_U}{\sum_n \rho_n t_n},$$

where $G_u$ is the product $(G_\delta) \cdot (G_{Fb})$, where $G_\delta = (1+2l_r)$, where $l_r$ is called an extention ratio associated with the rigid extension; n is an integer index associated with an $n^{th}$ sublayer of the piezoelectric layer; $\rho_n$ is a mass density of the $n^{th}$ sublayer of the piezoelectric layer; $t_n$ is a thickness of the $n^{th}$ sublayer.

18. The actuator of claim 1 wherein the drive system includes plural voltage sources connected to the actuator, the plural voltage sources simultaneously activated to drive the actuator.

19. The actuator of claim 1 wherein the drive system includes plural voltage sources connected to the actuator and configured to alternately drive the actuator.

20. The actuator of claim 1, wherein the passive material is disposed on the piezoelectric material.

21. The actuator of claim 1, wherein the passive material is integrated with the piezoelectric material.

22. The actuator of claim 1, wherein the piezoelectric material is sufficiently tapered to enhance actuator fracture load capability.

* * * * *